(12) United States Patent
Kuo

(10) Patent No.: US 6,753,195 B2
(45) Date of Patent: Jun. 22, 2004

(54) METHOD OF REPAIRING ORGANIC LIGHT-EMITTING ELEMENT PIXELS

(75) Inventor: Chih-Ming Kuo, Taipei (TW)

(73) Assignee: iTdisplay Corporation, Hsin Chu Industrial Park (TW)

( * ) Notice: Subject to any disclaimer, the term of this patent is extended or adjusted under 35 U.S.C. 154(b) by 0 days.

(21) Appl. No.: 10/449,008

(22) Filed: Jun. 2, 2003

(65) Prior Publication Data

US 2004/0096993 A1 May 20, 2004

(30) Foreign Application Priority Data

Jun. 3, 2002 (TW) ........................................ 91111911 A

(51) Int. Cl.[7] ............................................. H01L 21/66
(52) U.S. Cl. ............................. 438/14; 438/15; 438/17; 438/18; 438/99; 257/40
(58) Field of Search ............................. 257/40; 438/99, 438/14–18

(56) References Cited

U.S. PATENT DOCUMENTS 4,628,006 A * 12/1986 Rathbun et al. ............. 428/446
5,518,956 A * 5/1996 Liu et al. ......................... 438/4

* cited by examiner

Primary Examiner—Long Pham
Assistant Examiner—Wai-Sing Louie
(74) Attorney, Agent, or Firm—Birch, Stewart, Kolasch & Birch, LLP

(57) ABSTRACT

A method of repairing organic light-emitting element pixels for repairing an organic light-emitting element having a substantial short circuit portion or portions. The method includes an electrical testing step and an insulator-forming step. The organic light-emitting element includes an anode substrate, an organic functional layer and a cathode. In this case, a current or voltage is applied to the anode substrate and the cathode of the organic light-emitting element respectively in the electrical testing step, so that the short circuit portion or portions of the organic light-emitting element are transformed to an open circuit portion or portions. In the insulator-forming step, an insulator is formed at the open circuit portion or portions of the organic light-emitting element. The invention also discloses a method of repairing organic light-emitting element pixels, which further includes an electrical detection step. A short-circuit level of the organic light-emitting element is detected in the electrical detection step. When the ratio of the amount of the short circuit portions to the amount of the open circuit portions is less than a predetermined value, the insulator is formed on the open circuit portions in the subsequent insulator-forming step.

26 Claims, 3 Drawing Sheets

METHOD OF REPAIRING ORGANIC LIGHT-EMITTING ELEMENT PIXELS

BACKGROUND OF THE INVENTION

1. Field of the Invention

The invention relates to a method of repairing organic light-emitting element pixels, and in particular, to a method of repairing an organic light-emitting element having a substantial short circuit portion or substantial short circuit portions.

2. Description of the Related Art

In the manufacture of organic light-emitting element, a photolithography process is performed to define an anode and an auxiliary anode, and a process for forming organic and inorganic materials in a vacuum chamber is then performed. Herein, the inorganic material is used for forming a cathode layer. Since environmental factors such as moisture and oxygen may influence the lifetime of the organic light-emitting element, the organic light-emitting element must be encapsulated so as to maintain normal element operation.

During the manufacturing processes of the organic light-emitting element, the insufficient cleanliness in the clean room or the substrate defects may cause a short circuit in the organic light-emitting element. Moreover, electric current may only pass through the defects of the light-emitting element, such that not all of the pixels can be driven. Thus, inhibiting the light emitting efficiency of the element and reducing image display quality. Furthermore, if the organic light-emitting element is driven passively, not only is a single pixel not able to emit light, but an entire column or a row of pixels may be disabled.

Referring to FIG. 1, a conventional method of testing an organic light-emitting element for defects is to perform a panel testing step (S22) subsequent to an encapsulating step (S21). If the organic light-emitting element has a short circuit portion or short circuit portions, the defects in the individual pixels inside the element cannot be repaired as the element has already been encapsulated. Thus, the encapsulated element must be totally discarded. Accordingly, product yield decreases and manufacturing cost increases.

SUMMARY OF THE INVENTION

It is therefore an objective of the invention to provide a method of repairing organic light-emitting element defects, which is capable of reducing manufacturing cost, and increasing product yield and reliability.

To achieve the above-mentioned objective, the invention provides a method of repairing organic light-emitting element defects. The organic light-emitting element includes an anode substrate, an organic functional layer and a cathode, and has a substantial short circuit portion or substantial short circuit portions. The method includes an electrical testing step and an insulator-forming step. In the electrical testing step, a current or voltage is applied to the anode substrate and the cathode of the organic light-emitting element respectively, so that the short circuit portion or portions of the organic light-emitting element can be changed to an open circuit portion or portions. In the insulator-forming step, an insulator is formed at the open circuit portion or portions of the organic light-emitting element. The invention also provides a method of repairing organic light-emitting element pixels, which further includes an electrical detection step. In the electrical detection step, a short-circuited level of the organic light-emitting element is detected. Specifically, when the ratio of the amount of short circuit portions to the amount of open circuit portions is smaller than a predetermined value, or a leakage current is smaller than a predetermined value, an insulator is formed on the open circuit portion or portions in the subsequent insulator-forming step.

The invention provides a method of repairing organic light-emitting element pixels, which is used to repair the substantial short circuit portion or portions in the organic light-emitting element. The method is capable of detecting and repairing the short circuit portion or portions before the encapsulation process is performed. The method causes the short circuit portions to lose their electro conductivity, and enables the pixels with defects to have the same light-emitting ability as properly functioning adjacent pixels without defects. The method of the invention repairs the organic light-emitting element having defective portions without discarding the entire panel, thereby reducing manufacturing cost and increasing product yield and reliability.

BRIEF DESCRIPTION OF THE DRAWINGS

The invention will become more fully understood from the detailed description given in the herein below illustration only, and thus are not limitative of the invention, and wherein.

DETAILED DESCRIPTION OF THE INVENTION

The method of repairing organic light-emitting element pixels according to embodiments of the invention will be described with reference to the accompanying drawings.

It should be noted that an organic light-emitting element includes a pixel array containing a plurality of pixels. To simplify the description, only one pixel is described in the following embodiments of the invention.

Figure 1:
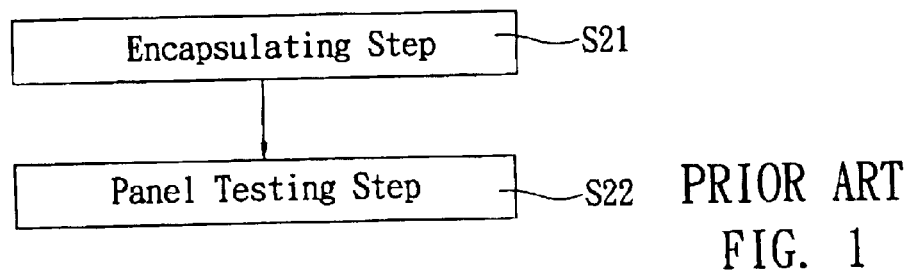
FIG. 1 is a block diagram showing a conventional method for detecting an organic light-emitting element.
Figure 2:
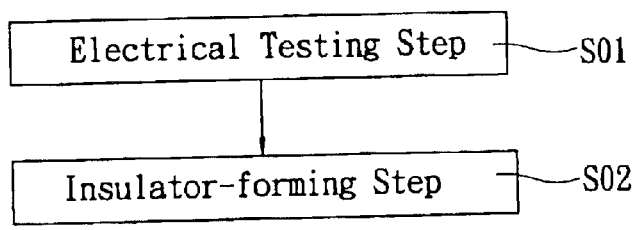
FIG. 2 is a block diagram showing a method of repairing organic light-emitting element pixels according to an embodiment of the invention.

The invention provides a method of repairing organic light-emitting element pixels, which is used to repair an organic light-emitting element 1 having a substantial short circuit portion or substantial short circuit portions. The organic light-emitting element 1 includes an anode substrate 11, an organic functional layer 12, and a cathode 13. As shown in FIG. 2, the method of repairing organic light-emitting element pixels includes an electrical testing step S01 and an insulator-forming step S02.

Figure 3A:
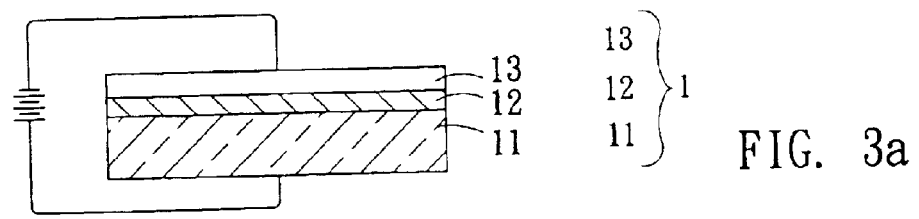
FIGS. 3a and 3b are schematic illustrations showing an organic light-emitting element in an electrical testing step according to the embodiment of the invention.
Figure 3B:
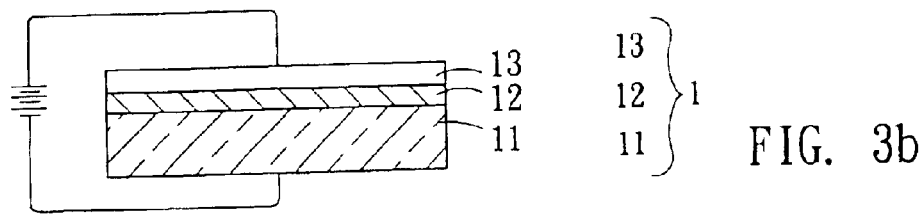

In this embodiment, referring to FIGS. 3a and 3b, a current or voltage is applied between the anode substrate 11 and the cathode 13 in the electrical testing step S01. Thus, the current or voltage generates heat transforming the short circuit portion of the organic light-emitting element 1 to an open circuit portion. In the insulator-forming step S02, an insulator 2 is formed at the open circuit portion of the organic light-emitting element 1.

In the current embodiment, the anode substrate 11 is a substrate sputtered with a conductive metal oxide such as indium-tin oxide (ITO), or aluminum-zinc oxide (AZO).

The organic functional layer 12 includes a hole injection layer, a hole transporting layer, an organic electroluminescent layer, an electron transporting layer, and an electron injection layer. The organic functional layer 12 can be formed by evaporation, spin coating, ink jet printing, or printing. In this case, the hole injection layer is mainly composed of copper phthalocyanine (CuPc), the hole transporting layer is mainly composed of 4,4'-bis[N-(1-naphthyl)-N-phenylamino]biphenyl (NPB), the electron injection layer is mainly composed of lithium fluoride (LiF), and the electron transporting layer is mainly composed of tris(8-quinolinato-N1,08)-aluminum (Alq).

The cathode 13 is formed by evaporation, E-gun coating, or sputtering. In the current embodiment, the cathode 13 is made of aluminum, aluminum/lithium, calcium, magnesium-silver alloys, or silver.

With reference to FIG. 3a, a positive voltage and a negative voltage are applied to the anode and the cathode respectively in the electrical testing step S01, so that the substantial short circuit portion of the organic light-emitting element 1 is transformed to an open circuit portion. Alternatively, a negative voltage and a positive voltage may be applied to the anode and the cathode, respectively, as shown in FIG. 3b. It should be noted that the electrical testing step S01 is performed in a buffer chamber or a single chamber, which may be vacuumed or filled with inert gas.

Figure 4A:
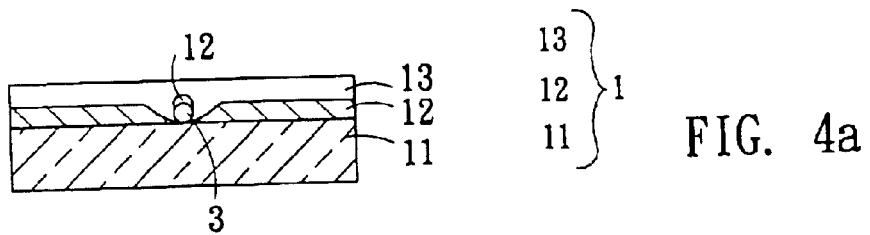
FIGS. 4a and 4b are schematic illustrations showing an organic light-emitting element having a short circuit portion according to the embodiment of the invention.

In the embodiment, the substantial short circuit portion is totally short-circuited or approximately short-circuited. There are two conditions that cause the substantial short circuit portion or portions in the organic light-emitting element 1. As for the first condition, if the cleanliness of the clean room environment is insufficient during manufacture of the organic light-emitting element, an impurity 3, such as a bubble or a particle, may exist in the organic light-emitting element 1. As shown in FIG. 4a, the impurity 3 may create the substantial short circuit portion in the organic light-emitting element. As for the second condition, when the surface of the anode is too rough, the substantial short circuit portion or portions may also arise as shown in FIG. 4b.

Figure 4B:
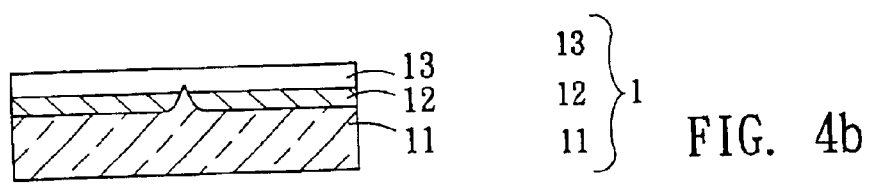
Figure 5A:
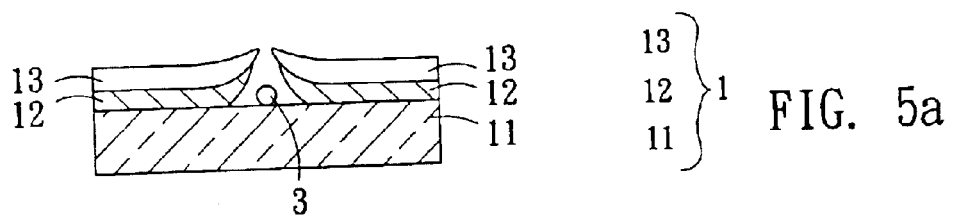
FIGS. 5a and 5b are schematic illustrations showing an open circuit portion after performing the electrical testing step according to the embodiment of the invention.
Figure 5B:
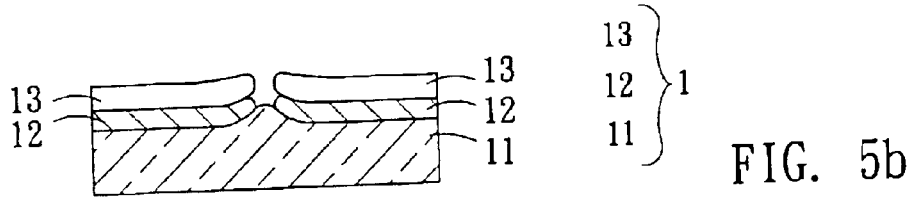

FIGS. 5a and 5b show the open circuit portion, which is formed from the short circuit portion (as shown in FIGS. 4a and 4b) in the electrical testing step S01, of the organic light-emitting element 1. During manufacture of the organic light-emitting element, the film-formed surface of the substrate often faces downwards. Thus, referring to FIGS. 5a and 5b, the organic functional layer 12 and cathode 13 may curve outwardly after the electrical testing step S01. In such a case, if the insulator-forming step S02 is not performed immediately to form an insulator on the open circuit portion, as long as the film-formed surface of the substrate is turned upward by any chance in the subsequent manufacturing steps, the curved cathode 13 may contact the anode substrate 11 to form the short-circuited structure again.

Figure 6A:
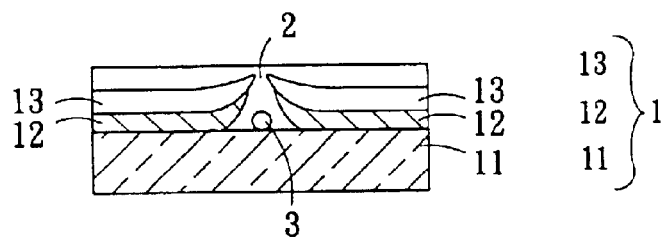
FIGS. 6a and 6b are schematic illustrations showing an organic light-emitting element in an insulator-forming step according to the embodiment of the invention.
Figure 6B:
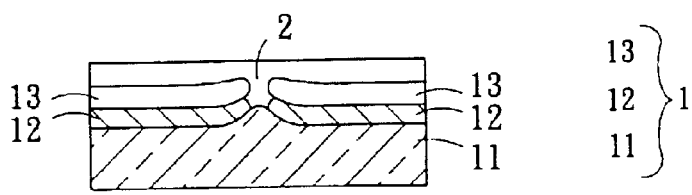

In the insulator-forming step S02, an insulator 2 is formed on the open circuit portion of the organic light-emitting element 1. With reference to FIGS. 6a and 6b, a part of the insulator 2 penetrates into the organic functional layer 12. In the step S02, the insulator 2 is formed on the open circuit portion by vacuum evaporation. Herein, the insulator may be made of an organic material such as that used to form the organic functional layer. For example, the organic material may be the material of a hole injection layer, a hole transporting layer, an organic electroluminescent layer, an electron transporting layer, or an electron injection layer of the organic functional layer. In addition, the insulator may be formed of the inorganic material such as silicon nitride, silicon oxide or silicon oxy-nitride. Moreover, when the manufacturing processes are performed in connection with a passivation forming system, a polymer, such as fluorocarbon resin or parylene having a high resistance, may be used as the material of the insulator.

In the insulator-forming step S02, the cathode 13 is oxidized in a moisture-free oxygen-containing atmosphere, so as to form an oxide layer on the surface of the cathode 13. The oxide layer, which is the insulator, is capable of isolating the cathode 13 and the anode substrate 11, and is capable of protecting the open circuit portion or portions.

Figure 7:
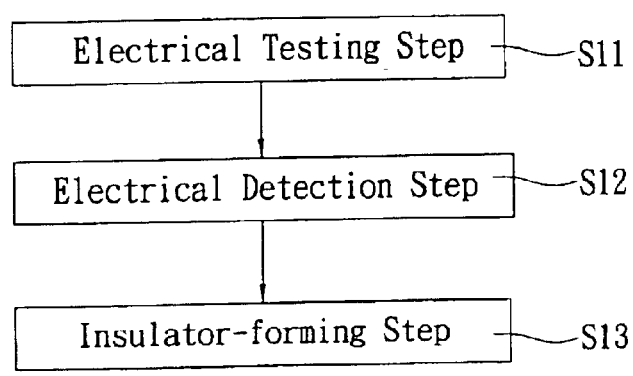
FIG. 7 is a block diagram showing a method of repairing organic light-emitting element pixels according to another embodiment of the invention.

FIG. 7 shows a method of repairing organic light-emitting element pixels according to another embodiment of the invention. Referring to FIG. 7, the method of repairing organic light-emitting element pixels includes an electrical testing step S11, an electrical detection step S12, and an insulator-forming step S13. In the present embodiment, all elements and characteristics are the same as those described in the former embodiment, with the exception of the electrical detection step S12 and the insulator-forming step S13.

In the embodiment, the electrical detection step S12 detects the short-circuit level of the organic light-emitting element 1 tested in the electrical testing step S11. When the short-circuit level is less than a predetermined value, an insulator 2 is formed on the open circuit portion in the insulator-forming step S13. The short-circuit level is a leakage current or a ratio of the amount of the short circuit portions to the amount of the open circuit portions. In the electrical testing step, when a constant voltage and a variable current are applied, the panel having defects consumes higher than normal current when positive voltage is applied. Conversely, the panel produces higher leakage current when negative voltage is applied. When a positive, constant current and a variable voltage are applied, the brightness of the panel is lower or not uniform. In such a case, if a photodiode is used to transform the brightness into a voltage value or a charge coupled device (CCD) is used to retrieve an image and its brightness, the testing errors increase.

In the electrical detection step S12, when the short-circuit level of the organic light-emitting element 1 is greater than the predetermined level (i.e., when the error result obtained by detecting the average leakage current or the brightness is greater than an acceptable value), the subsequent insulator-forming step S13 is not performed. Alternately, when the short-circuit level of the organic light-emitting element 1 is less than the predetermined level, the insulator-forming step S13 is performed to form the insulator 2 after the electrical detection step S12. When the short-circuit level of the organic light-emitting element 1 is greater than an acceptable range, and the organic light-emitting element 1 is not worth to be repaired, the electrical detection step S12 can reduce the loss of the insulator material. Therefore, the insulator-forming step S13 is only performed if the organic light-emitting element 1 requires to be repaired.

The method of repairing organic light-emitting element pixels of this invention can repair defects with the substantial short circuit portion or portions by forming an insulator.

Thus, the pixels, which cannot be driven due to the substantial short circuit portion or portions, achieve the same light-emitting abilities (e.g., efficiency, brightness, color purity, and the like) as those of properly functioning adjacent pixels. Compared to the prior art, the method solves the problems of current leakage, power consumption, and poor screen quality caused by substantial short circuit portion or portions. Furthermore, since the short circuit portions can be detected and repaired before the encapsulating process, it is unnecessary discard the entire having substantial short circuit portion or portions, thus manufacturing costs are reduced and product yield and reliability are enhanced.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadcast interpretation so as to encompass all such modifications.

What is claimed is:

1. A method of repairing organic light-emitting element pixels, which is used to repair an organic light-emitting element having a substantial short circuit portion, the organic light-emitting element comprising an anode substrate, an organic functional layer and a cathode, the method comprising:

an electrical testing step for applying a current or voltage between the anode substrate and the cathode so as to transform the substantial short circuit portion to an open circuit portion; and an insulator-forming step for forming an insulator at the open circuit portion.

2. The method of claim 1, wherein the insulator is formed on the open circuit portion in the insulator-forming step.

3. The method of claim 1, wherein the cathode is oxidized within a moisture-free oxygen-containing atmosphere in the insulator-forming step.

4. The method of claim 1, wherein a part of the insulator penetrates into the organic functional layer.

5. The method of claim 1, wherein the insulator is made of the same material of a hole injection layer of the organic functional layer.

6. The method of claim 1, wherein the insulator is made of the same material of a hole transporting layer of the organic functional layer.

7. The method of claim 1, wherein the insulator is made of the same material of an organic electroluminescent layer of the organic functional layer.

8. The method of claim 1, wherein the insulator is made of the same material of an electron transporting layer of the organic functional layer.

9. The method of claim 1, wherein the insulator is made of the same material of an electron injection layer of the organic functional layer.

10. The method of claim 1, wherein the insulator is made of an inorganic material with high resistance.

11. The method of claim 1, wherein the insulator is made of an organic material with high resistance.

12. The method of claim 1, wherein the insulator is made of a polymer material with high resistance.

13. A method of repairing organic light-emitting element pixels, which is used to repair an organic light-emitting element having a substantial short circuit portion, the organic light-emitting element comprising an anode substrate, an organic functional layer and a cathode, the method comprising:

an electrical testing step for applying a current or voltage between the anode substrate and the cathode so as to transform the substantial short circuit portion to an open circuit portion;

an electrical detection step for detecting a short-circuit level of the organic light-emitting element; and an insulator-forming step for forming an insulator at the open circuit portion when the short-circuit level detected in the electrical detection step is smaller than a predetermined value.

14. The method of claim 13, wherein the short-circuit level is a ratio of the amount of the short circuit portions to the amount of the open circuit portions.

15. The method of claim 13, wherein the short-circuit level is a leakage current level.

16. The method of claim 13, wherein the insulator is formed on the open circuit portion in the insulator-forming step.

17. The method of claim 13, wherein the cathode is oxidized within a moisture-free oxygen-containing atmosphere in the insulator-forming step.

18. The method of claim 13, wherein a part of the insulator penetrates into the organic functional layer.

19. The method of claim 13, wherein the insulator is made of the same material of a hole injection layer of the organic functional layer.

20. The method of claim 13, wherein the insulator is made of the same material of a hole transporting layer of the organic functional layer.

21. The method of claim 13, wherein the insulator is made of the same material of an organic electroluminescent layer of the organic functional layer.

22. The method of claim 13, wherein the insulator is made of the same material of an electron transporting layer of the organic functional layer.

23. The method of claim 13, wherein the insulator is made of the same material of an electron injection layer of the organic functional layer.

24. The method of claim 13, wherein the insulator is made of an inorganic material with high resistance.

25. The method of claim 13, wherein the insulator is made of an organic material with high resistance.

26. The method of claim 13, wherein the insulator is made of a polymer material with high resistance.

* * * * *

UNITED STATES PATENT AND TRADEMARK OFFICE
CERTIFICATE OF CORRECTION

PATENT NO. : 6,753,195 B2
DATED : June 22, 2004
INVENTOR(S) : Chih-Ming Kuo

It is certified that error appears in the above-identified patent and that said Letters Patent is hereby corrected as shown below:

<u>Title page,</u>
Item [73], Assignee, should read
-- RiTdisplay Corporation, Hsin Chu Industrial Park (TW) --

Signed and Sealed this

Eighth Day of March, 2005

JON W. DUDAS
*Director of the United States Patent and Trademark Office*